United States Patent [19]

Hirabayashi et al.

[11] Patent Number: 4,707,717
[45] Date of Patent: Nov. 17, 1987

[54] SEMICONDUCTOR MEMORY DEVICE

[75] Inventors: Kazuo Hirabayashi, Itami; Makoto Yamamoto, Amagasaki, both of Japan

[73] Assignee: Mitsubishi Denki Kabushiki Kaisha, Japan

[21] Appl. No.: 801,805

[22] Filed: Nov. 26, 1985

[30] Foreign Application Priority Data

Dec. 5, 1984 [JP] Japan ................................ 59-258661

[51] Int. Cl.⁴ ..................... H01L 29/78; H01L 21/88; H01L 29/44; H01L 21/76
[52] U.S. Cl. ............................... 357/23.11; 357/23.5; 357/45; 357/65; 357/68; 357/71
[58] Field of Search ....................... 357/65, 68, 71, 45, 357/23.5, 23.11

[56] References Cited

U.S. PATENT DOCUMENTS 4,289,834 9/1981 Alcorn et al. ........................ 357/68
4,471,373 9/1984 Shimizu et al. ..................... 357/23.5

FOREIGN PATENT DOCUMENTS 3106202 12/1981 Fed. Rep. of Germany .
3145102 6/1982 Fed. Rep. of Germany .
3230067 3/1983 Fed. Rep. of Germany .
3247197 7/1983 Fed. Rep. of Germany .
3316096 8/1984 Fed. Rep. of Germany .
58-87876 5/1983 Japan ................................. 357/23.5
59-35477 2/1984 Japan ................................. 357/45

OTHER PUBLICATIONS

"A High-Denisty, High-Performance EEPROM Cell, Schauer et al., IEEE Transactions on Electron Devices, vol. Ed-29, No. 8, Aug. 1982.

Primary Examiner—Martin H. Edlow
Assistant Examiner—Jerome Jackson, Jr.
Attorney, Agent, or Firm—Leydig, Voit & Mayer

[57] ABSTRACT

A semiconductor integrated circuit memory device in which FET memory transistor cells are disposed in a matrix wherein the source diffusion channels form a data path for each column of cells while the drain diffusion channels and gate electrodes are used for row and column addressing, respecitvely, and has extremely reliable ohmic contacts by virtue of a different pattern of the field insulating film used in the manufacturing process, as a result of which the depth of a source contact hole and a drain contact hole are substantially equal.

8 Claims, 42 Drawing Figures

FIG. IC  PRIOR ART
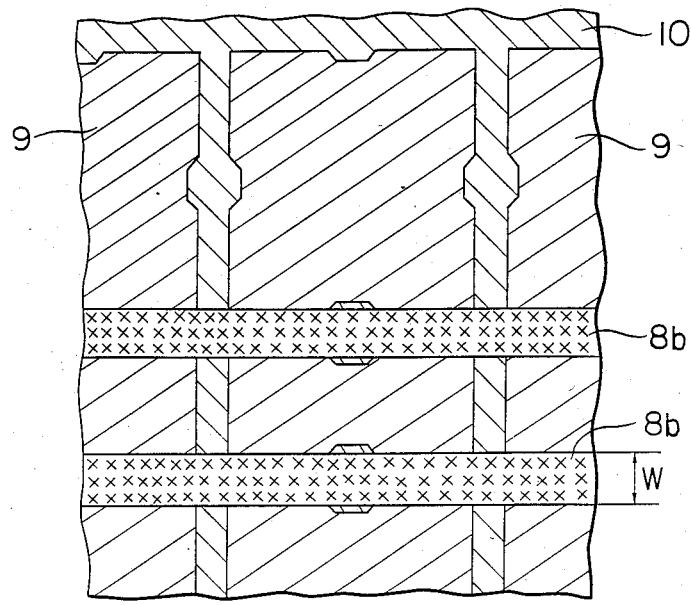
FIG. ID  PRIOR ART
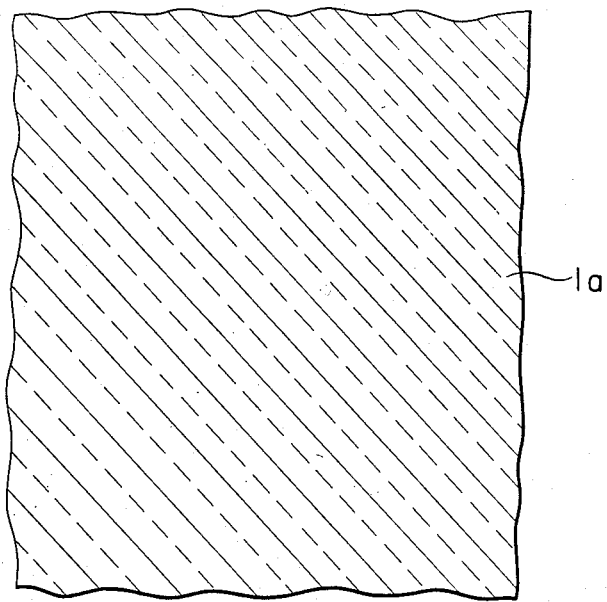

SEMICONDUCTOR MEMORY DEVICE

BACKGROUND OF THE INVENTION

This invention relates to semiconductor integrated circuit devices in general and, more particularly, to an improved memory device constructed of a memory array portion to be connected to a peripheral circuit. The memory array portion is formed of field effect transistor cells disposed in a matrix. A method of manufacturing the same is provided.

In a prior art process of forming such structures, plane configurations of a semiconductor substrate, a field insulating film, a floating gate electrode layer, a (control) gate electrode layer, a contact hole, and a metallic wire layer are sequentially formed, as shown in FIGS. 1A-1F. It is noted that the cross-sectional views taken along the plane of line II-II' and III-III' for each of FIGS. 1A-1F are shown in FIGS. 2A-2F and 3A-3F, respectively.

In FIGS. 1F, 2F, and 3F, there is shown a polysilicon gate electrode layer forming gate electrodes 1 providing an address line for each column of the cells in the memory matrix. A source diffusion layer in the substrate forms source diffusion channels 2 disposed in parallel with the gate electrodes 1 to provide a data line for each column of cells in the matrix. A drain diffusion layer forms drain diffusion channels 3 disposed perpendicularly to the gate electrodes 1 and source diffusion channels 2 to provide the address line for each row of the cells in the memory matrix. A source contact hole 4 filled with metal provides an ohmic contact node which connects a source diffusion channel 2 to a peripheral circuit when the data stored in one of the array cells is to be read out. An aluminum wire layer forms lead wires 6 disposed perpendicularly to the gate electrodes 1. Thus, the metallic wire layer forms a data lead wire 6 which connects to a source diffusion channel 2 through the metal-filled source contact hole 4. A second aluminum wire layer forms a second set of lead wires 7 disposed in parallel with the first set of lead wires 6 and connects to a drain diffusion channel 3 through the metal-filled drain contact hole 5 to form a row select lead wire.

A memory cell is produced wherever a drain diffusion channel 3 crosses both a polysilicon gate electrode 1 and a source diffusion channel 2. Such a memory transistor cell is of the stacked-gate structure type having a control gate electrode 1 over a floating gate electrode 8. While the control gate electrode is connected to the column select line, the function of the floating gate is to store charges almost indefinitely. As shown in FIG. 2F, each memory transistor cell has, on a semiconductor substrate 10, a thin floating gate oxide 11, a first layer of polysilicon forming a floating gate electrode 8, a thin control gate oxide 12, and a second layer of polysilicon forming a control gate electrode 1. A field insulating $SiO_2$ film 9 is disposed on the substrate 10 and is etched therefrom to provide film-free regions above those portions which are to become the source diffusion channels and the drain diffusion channels. Thus, the field insulating layer 9 divides the substrate 10 into a number of predetermined areas in which the memory cells and diffusion channels will be contructed, as well as provides insulating isolation among those cells.

In the following paragraphs, the conventional method of manufacturing a memory device of the nature described above will be explained with reference to FIGS. 1-3. The drawbacks of such a method will be pointed out as background for an explanation of the present invention.

As illustrated in FIGS. 1A, 2A, and 3A, the field insulating film 9 of 7000-8000 Å thickness is selectively formed on the semiconductor substrate 10, and then a thin oxide film 11a (500Å) is formed on the entire surface of the substrate 10. For the sake of convenience, the oxide film 11a is not shown in FIGS. 1A-1F. A 3000 Å thick polysilicon layer 8a is then formed on the substrate 10 over the oxide film 11a, as shown in FIGS. 1B and 2B. The polysilicon layer 8a is selectively removed, by an etching process, to form bands of polysilicon 8b of width "W", as shown in FIG. 1C. The polysilicon bands 8b define the memory array portion constructed of a plurality of FET memory cells, each of which has a gate electrode of a two-layered structure with the polysilicon film 8b representing the bottom floating gate electrode of such a structure. A 600 Å oxide film 12a is then formed on the entire surface of the substrate 10 covering the oxide film 11a, as shown in FIG. 3C, as well as the polysilicon bands 8b, as shown in FIG. 2C. Again, for the sake of convenience, the oxide film 12a is not shown in FIGS. 1C-1F. Over the entire surface of the oxide film 12a, a second layer 1a of polysilicon is formed, as shown in FIGS. 1D, 2D, and 3D. This second polysilicon layer 1a, which has a thickness of about 3000 Å, represents the top gate electrode of the two-layered transistor structure of the memory cell.

In order to define contact holes for the source and drain lead wires and gate electrodes for each memory cell, the entire polysilicon film 1a is selectively etched. After this etching process, the control gate electrode 1 will be defined for each memory cell, as shown in FIG. 2F, as well as for the structure of FIG. 3E which does not represent a circuit element. Using the gate electrode 1 as a mask, the oxide film 12a, the polysilicon bands 8b, and the oxide film 11a are successively etched to respectively form the control gate oxide 12, the floating gate electrode 8, and the floating gate oxide 11 in this order under the gate electrode 1. It is to be noted that the structure shown in FIG. 3E, which is a sectional view taken along the plane of lines III-III' (FIG. F), does not include a polysilicon band 8b as shown in FIG. 1C. This implies that, since the successive etching process described above is simultaneously performed on the entire substrate surface as defined by the gate mask, the groove resulting in FIG. 3E will be over-etched.

The source diffusion channels 2 and the drain diffusion channels 3 are then formed by a common diffusion technique in the semiconductor substrate, as shown in FIGS. 1E, 2E and 3E. An insulating layer 13 (8000 Å) is then disposed on the entire surface of the substrate 10 covering the diffusion channels as well as the layered gate structures. The insulating layer 13 is then etched so as to form the source contact hole 4 shown in FIG. 3F and the drain contact hole 5 shown in FIG. 2F. Finally, the metallic lead wires 6 and 7 are disposed (or deposited) perpendicularly to the columns of gate electrodes 1 and source diffusion channels 2, both of which are covered by the insulating layer 13 except at the contact holes. The source and drain contact holes 4 and 5 are filled by metal of the metallic lead wires 6 and 7 which form a data lead wire and a row select lead wire, respectively. This results in the completion of the semiconductor memory device.

The emphasis of the present invention is on two structures of the proposed memory device. The first (hereafter referred to as the primary structure) is the stacked-gate memory cell whose sectional view along the plane of line II–II' is shown in FIG. 2F and includes the drain contact hole 5. The second (hereafter referred to as the secondary structure) includes a single-gate electrode layered structure 1 in the vicinity of the connection between the metallic lead wire 6 and the source diffusion channel 2. Although the secondary structure is not a circuit element, it includes the metallic lead wire 6 which plays the role of transferring data appearing on the source diffusion channel to other peripheral circuits or, simply, to the output terminals. The sectional view taken along the plane of lines III–III' (FIG. 1F) shows the composition of the secondary structure as illustrated in FIG. 3F.

Comparing the two structures of FIGS. 2F and 3F, it is noted that the substrate 10 at the contact hole 4 is over-etched, as previously explained. Therefore, the depth T2 of the source contact hole 4, which is the difference in level between the upper surface of the source diffusion channel 2 of the secondary structure and the lower surface of the metallic lead wire 6, is represented by:

$T2 =$ (the film thickness of the insulating layer 13) +

(the film thickness of the gate electrode 1) +

(the film thickness of the gate oxide 12) +

(the film thickness of the floating gate oxide 11) +

(the film thickness of the field insulating layer 9) +

(the etching thickness of the semiconductor substrate 10) =

$8000 + 3000 + 600 + 500 + 8000 + \alpha = 20,100 + \alpha(\text{Å})$.

On the other had, the depth T1 of the drain contact hole 5, which is the difference in level between the upper surface of the substrate 10 and the lower surface of the metallic lead wire 7, is represented by:

$T1 =$ (the film thickness of the smooth insulating layer 13) +

(the film thickness of the gate electrode 1) +

(the film thickness of the gate oxide 12) +

(the film thickness of the floating gate 8) +

(the film thickness of the floating gate oxide 11) =

$8000 + 3000 + 600 + 3000 + 500 = 15,100$ (Å).

As can be seen, according to the conventional manufacturing method, the depth of the drain contact hole is less than that of the source contact hole. Hence, upon the concurrent formation of the source contact hole 4 and the drain contact hole 5, when one intends to conform the etching depths of both the source and drain contact holes to that of the drain contact hole 5, the source metal contact will not reach the surface of the substrate, resulting in a defective device. On the other hand, when one intends to conform the etching depths to that of the source contact hole 4, the height of the drain metal contact will be increased, disadvantageously, resulting in uneven overall thickness of the structures on the chip which is wasteful of area. Moreover, even if the source contact hole 4 is completely formed, there is still the risk of a disconnection between the metallic lead wires and the semiconductor substrate 10 due to the deep contact holes resulting from excessive etching.

SUMMARY OF THE INVENTION

In order to overcome the problem discussed in the background section, the present invention uses different patterns for both the field insulating film and the floating gate film, which results in a source contact hole having the same depth as a drain contact hole. Thus, by making both the primary (memory cell) and the secondary (source contact portion) structures identical, disconnection failures of metallic lead wires and unreliable ohmic contacts can be avoided. Moreover, the overall height of the structures on the wafer is reduced.

It is, accordingly, an object of the present invention to provide a novel structure of a semiconductor integrated circuit memory device in which FET memory cells of the stacked-gate type are disposed in a matrix. In this device, the source diffusion channels and the gate electrodes extend in the direction of the matrix columns while the drain diffusion channels extend in the direction of the matrix rows perpendicular to the source diffusion channels and gate electrodes. Each source diffusion channel connects the memory cells of the respective column to the corresponding data line while drain diffusion channels and control gate electrodes are used for row and column selection, respectively. According to the invention, extremely reliable ohmic contacts are provided to connect the memory array cells through address and data lines to the peripheral circuitry, such as address decoders, input-output buffers, and other external or on-chip devices. Such reliability is achieved by virtue of the structure of the portion connecting the data diffusion channels and the metallic lead wires.

BRIEF DESCRIPTION OF THE DRAWINGS

FIGS. 1A–1F are process plan views of steps in one prior art method of manufacturing a semiconductor memory device;

DETAILED DESCRIPTION OF THE PREFERRED EMBODIMENTS

Figure 1A:
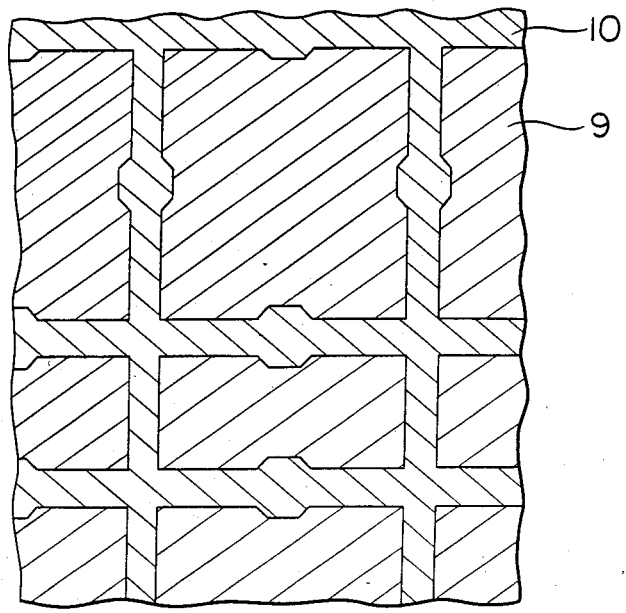
Figure 1B:
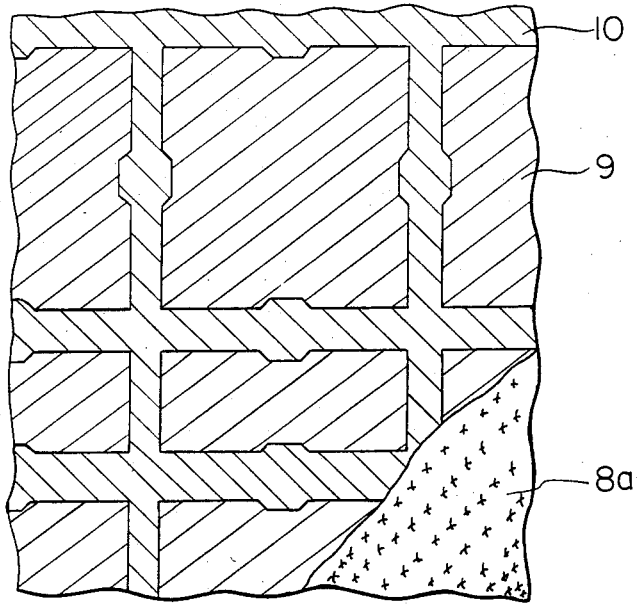
Figure 1E:
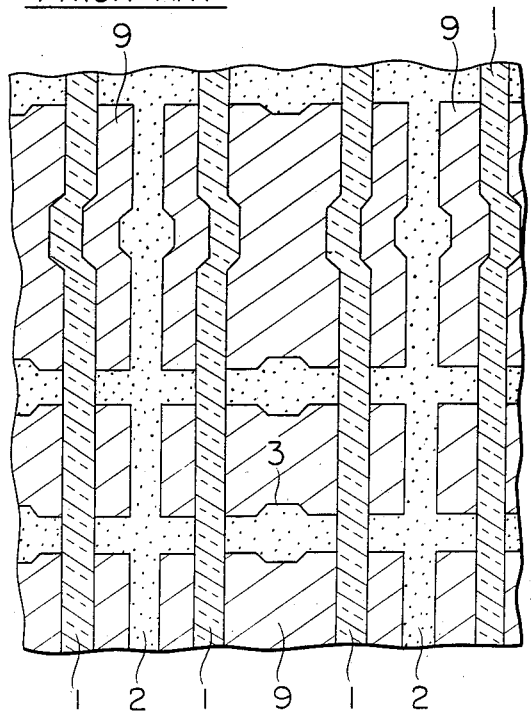
Figure 1F:
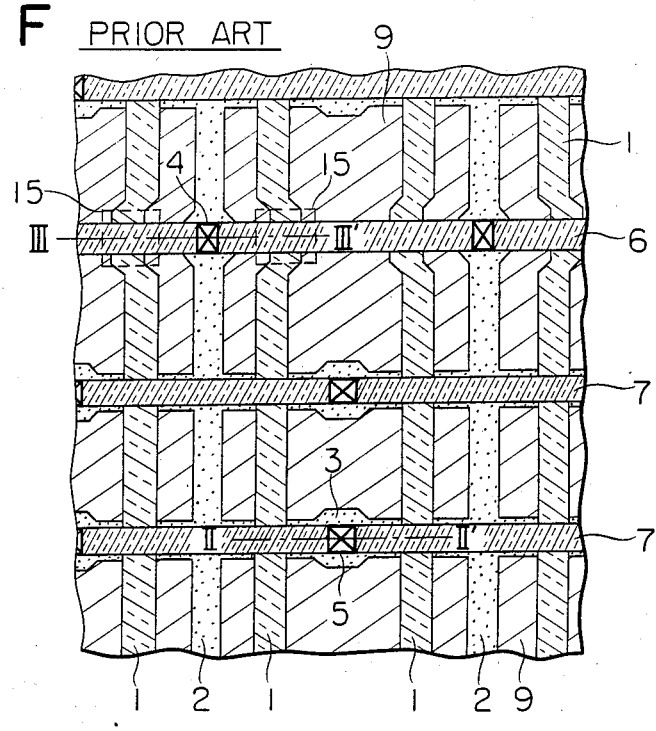
Figure 3A:
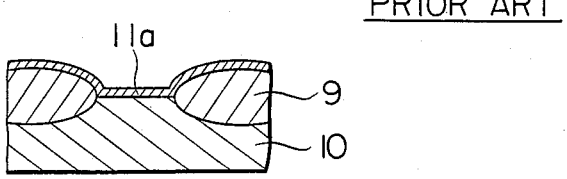
FIGS. 3A–3F are process cross-sectional views taken along the plane of line III–III' of the semiconductor memory matrix shown in FIG. 1F corresponding to the process steps of FIGS. 1A–1F.
Figure 3B:
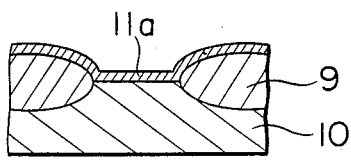
Figure 3C:
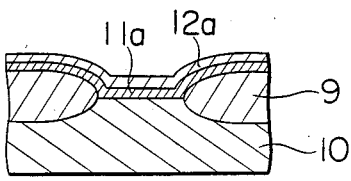
Figure 3D:
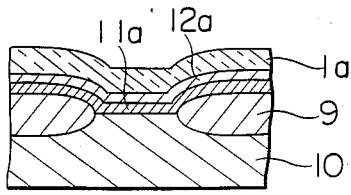
Figure 3E:
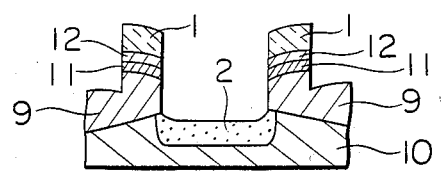
Figure 3F:
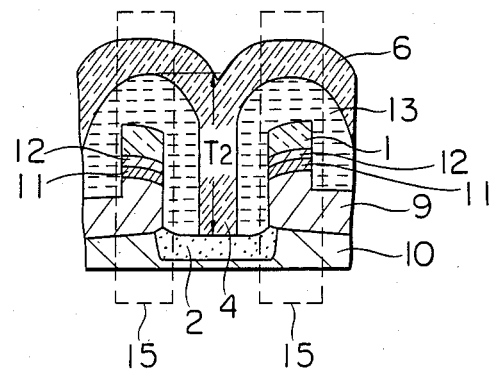
Figure 4A:
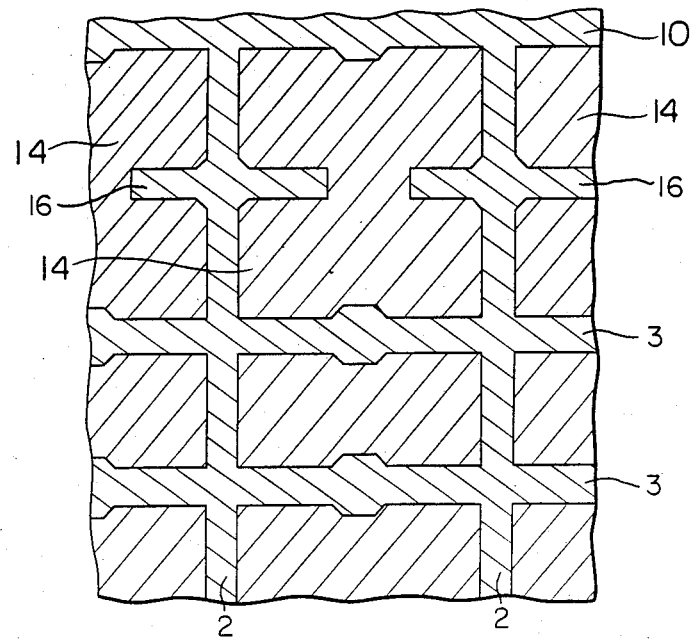
FIGS. 4A–4F are process plan views of steps in a method of manufacturing one embodiment of a semiconductor memory device according to the present invention.
Figure 4B:
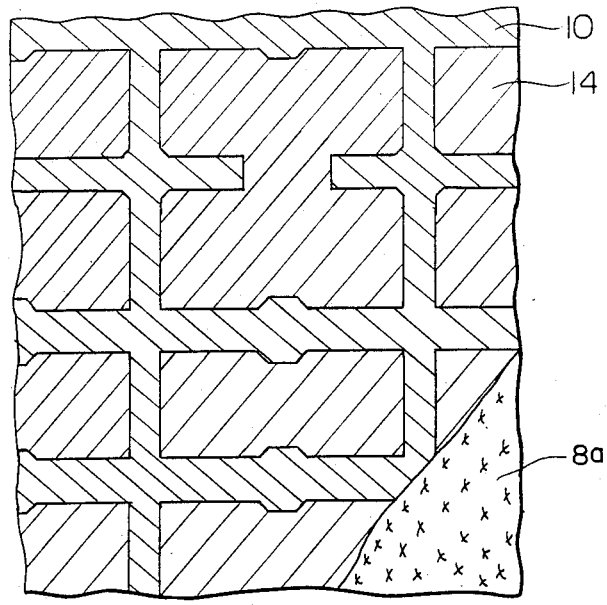
Figure 4C:
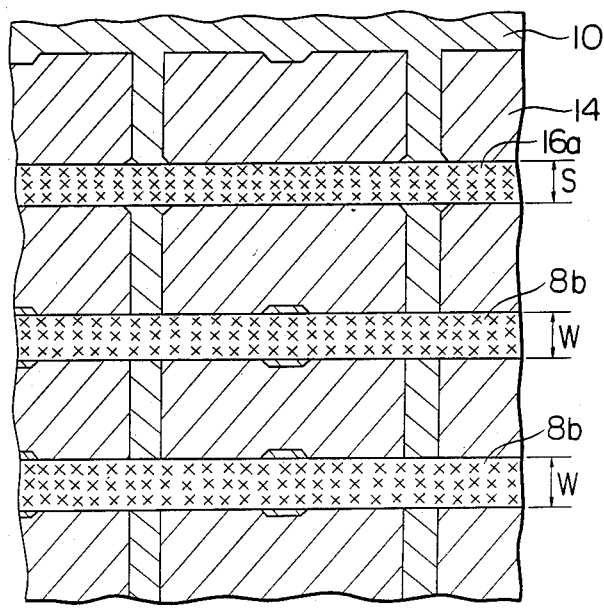
Figure 4D:
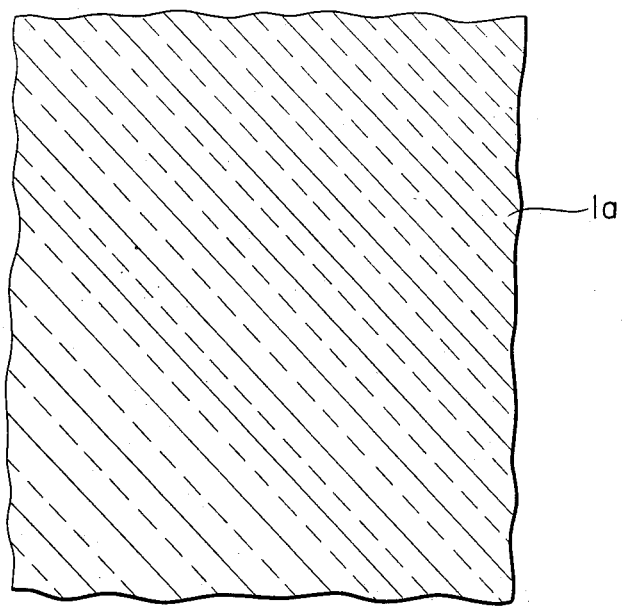
Figure 4E:
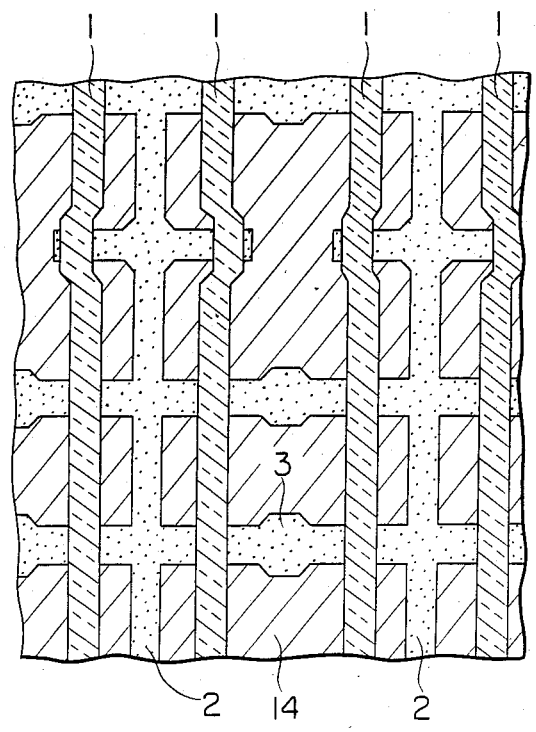
Figure 4F:
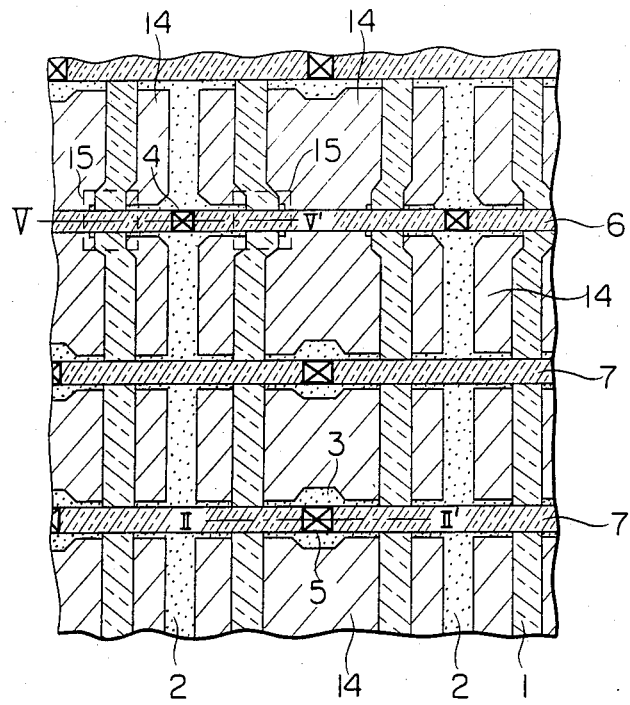
Figure 5A:
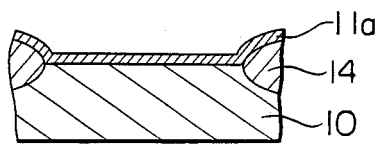
FIGS. 5A–5F are process cross-sectional views taken along the plane of line V–V' of the semiconductor memory matrix shown in FIG. 4F corresponding to the process steps of FIGS. 4A–4F according to the present invention.
Figure 5B:
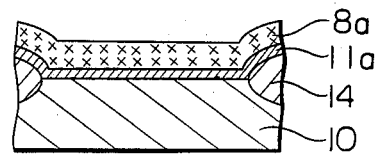
Figure 5C:
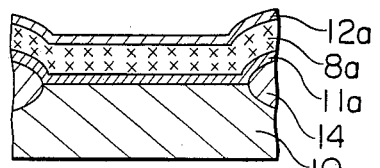
Figure 5D:
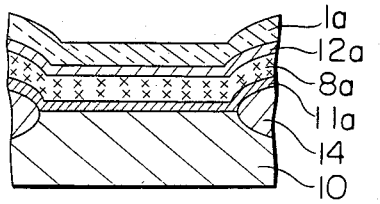

First, one embodiment of the semiconductor memory device according to the present invention will be described with reference to FIGS. 2, 4, and 5. FIGS. 4A-4F show the sequential formation of the plane configurations of a semiconductor substrate, a field insulating film, a floating gate electrode layer, a control gate electrode layer, a contact hole, and a metallic wire layer. The process cross-sectional views taken along the plane of line V-V' of the memory matrix of FIG. 4F and corresponding to the process steps of FIGS. 4A-4F are shown in FIGS. 5A-5F. The process cross-sectional views taken along the plane of line II-II' of the memory matrix of FIG. 4F are identical to those shown in FIG. 2. While the same reference numerals 1-13 indicate corresponding elements throughout FIGS. 1-8, in the embodiments of the present invention, the structure or pattern of the field insulating film 9 of the prior art memory device shown in FIG. 1A is modified to the pattern shown in FIG. 4A in which the field insulating film is indicated by the numeral 14 instead of 9. This field insulating film 14 has a structure which divides the substrate 10 into a number of predetermined areas, namely, the field insulating film 14 covers the entire substrate 10 except for the areas defined by vertical bands 2 representing film-free areas above the yet to be formed source diffusion channels and horizontal bands 3 representing the film-free areas above the yet to be formed drain diffusion channels, as indicated in FIG. 4A. In FIG. 4A, it is noted that, in addition to the vertical source diffusion channels 2 and the horizontal drain diffusion channels 3, there is another exposed area of the substrate in the form of short horizontal bands 1b in which the secondary structure (referred to in the background section) will be constructed. This secondary structure refers to the ohmic contact nodes connecting the source diffusion channels and the metallic lead wires as well as the region extending from such a contact node to the gate electrode structure on either side of it. Thus, the secondary structure includes the source contact hole 4 on both sides of which a stacked-gate structure is formed within a region 15. The cross-sectional view of this stacked-gate structure within the region 15 is shown in FIG. 5F. By comparing the sectional views of region 15 in FIGS. 3F and 5F, it will be seen that, according to the present invention (FIG. 5F), in addition to removing the field insulating film 9 from this region, a dummy floating gate electrode 16 is introduced under the gate electrode 1, thus resulting in a stacked-gate structure identical to that of the memory cell shown in FIG. 2F. It is to be noted that the memory cell is referred to as a primary structure of the memory device (as explained in the background section).

Next, the process of manufacturing the semiconductor memory device thus arranged, in accordance with the present invention, will be described with reference to FIGS. 2, 4, and 5.

Figure 2A:
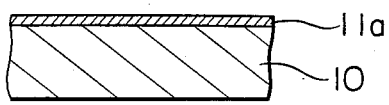
FIGS. 2A–2F are process cross-sectional views taken along the plane of line II–II' of the semiconductor memory matrix shown in FIGS. 1F and 2F corresponding to the process steps of FIGS. 1A–1F.
Figure 2B:
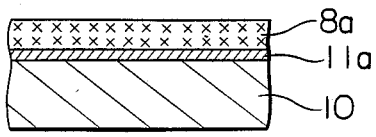
Figure 2C:
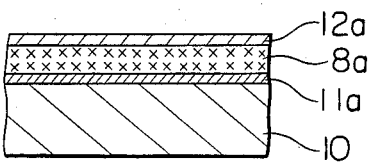
Figure 2D:
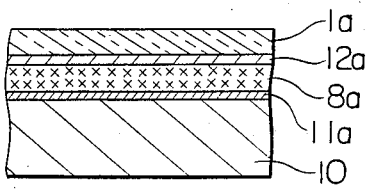

First, a 7000-8000 Å field insulating film 14 is selectively formed on the substrate 10 in order to define the horizontal and vertical drain and source diffusion channels which form the memory matrix, as well as outline the short horizontal bands 1b of the secondary structure, as illustrated in FIG. 4A. Then, the 500 Å oxide film 11a (not shown in FIGS. 4A-4F) is formed on the entire surface of the substrate 10, thus covering the field insulating film 14, as shown in FIGS. 2A and 5A. The polysilicon film 8a of 3000 Å thickness is then formed on the entire surface of the substrate 10, as shown in FIGS. 4B, 2B, and 5B. The polysilicon film 8a is thereafter selectively etched so as to form horizontal bands 8b having a width "W" and covering the row channels of the matrix as well as horizontal bands 16a having a width "S" and parallel to the matrix rows, as shown in FIG. 4C. Thereafter, the 600 Å oxide film 12a (not shown in FIGS. 4A-4F) is formed on the entire surface of the substrate 10 covering the polysilicon bands 8b and 16a and the oxide film 11a, as shown in FIGS. 2C and 5C. Then, the 3000 Å polysilicon film 1a is formed on the entire surface of the oxide film 12a, as shown in FIGS. 2D, 4D, and 5D.

Figure 2E:
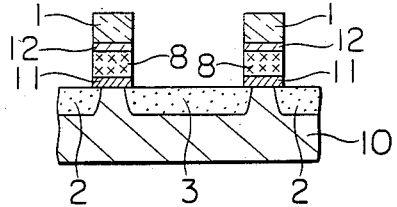
Figure 2F:
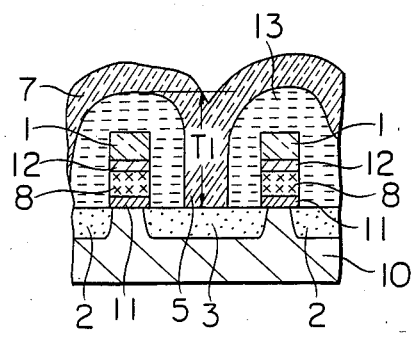
Figure 5E:
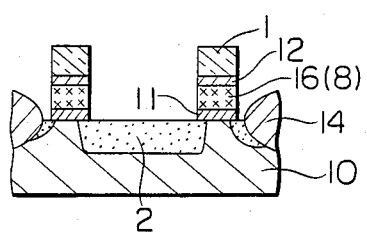
Figure 5F:
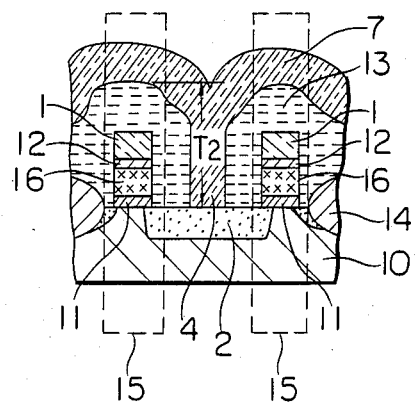
Figure 6A:
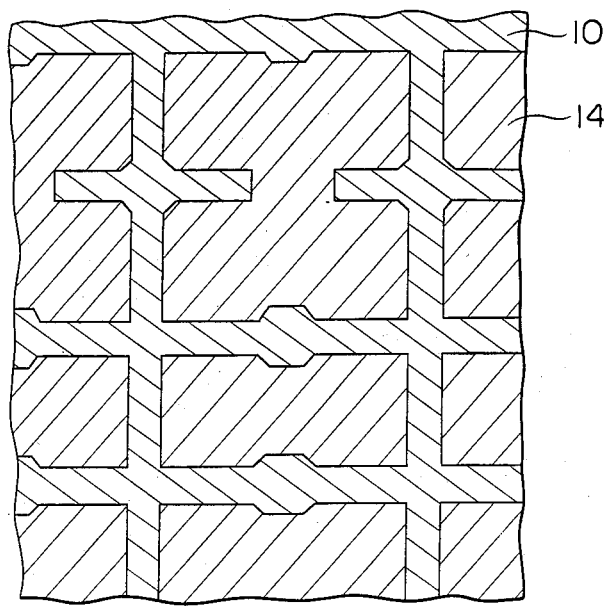
FIGS. 6A–6D are process plan views of steps in a method of manufacturing another embodiment of the semiconductor memory device according to the present invention.
Figure 6B:
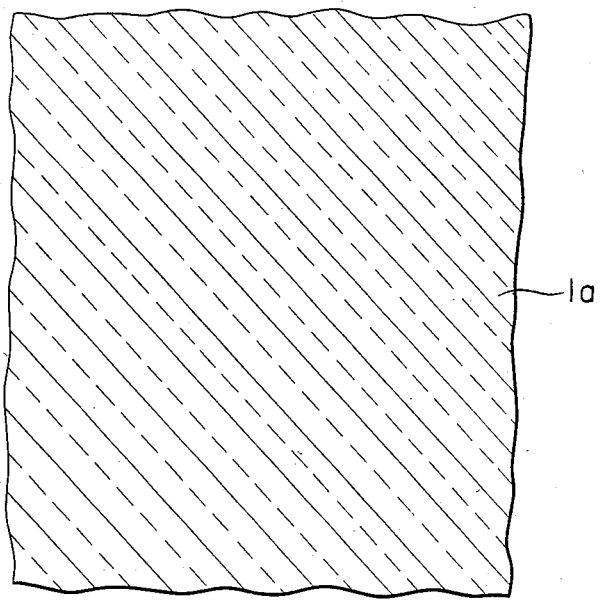
Figure 6C:
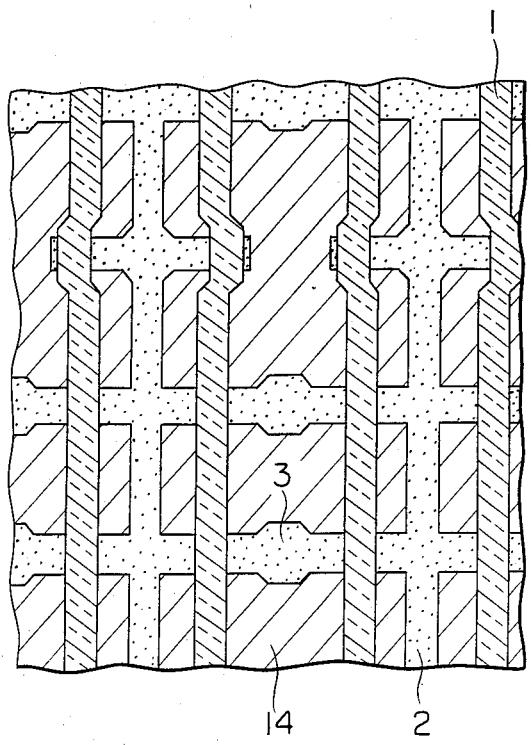
Figure 6D:
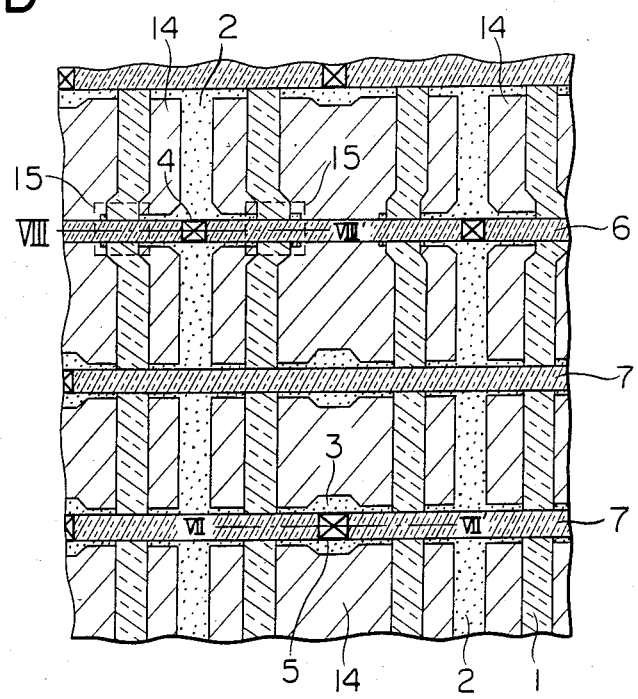
Figure 7A:
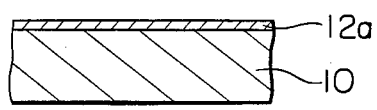
FIGS. 7A–7D are process cross-sectional views taken along the plane of line VII–VII' of the memory array shown in FIG. 6D corresponding to the process steps of FIGS. 6A–6D according to the present invention.
Figure 7B:
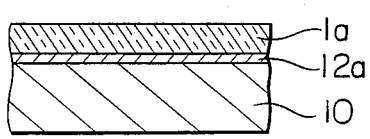
Figure 7C:
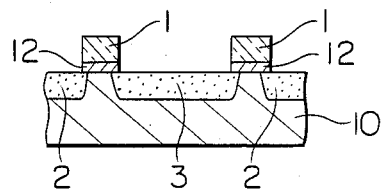
Figure 7D:
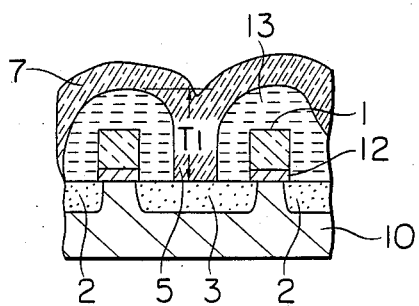
Figure 8A:
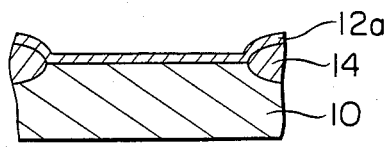
FIGS. 8A-8D are process cross-sectional views taken along the plane of line VIII-VIII' of the memory array shown in FIG. 6D corresponding to the process steps of FIGS. 6A-6D according to the present invention.
Figure 8B:
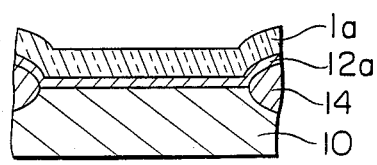
Figure 8C:
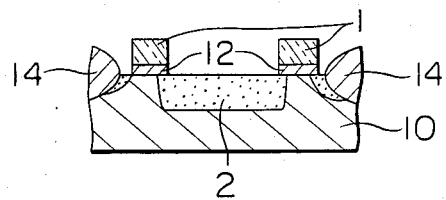
Figure 8D:
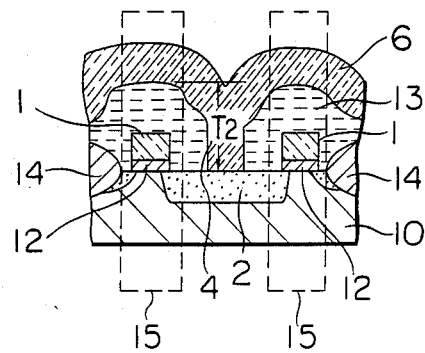

The film arrangement thus layered is etched to form the profile shown in FIGS. 2E and 5E, i.e., the polysilicon film 1a is selectively etched so as to form the gate electrode 1 having the geometry shown in FIGS. 2E and 5E. After this etching process, the gate electrode will thus be defined for both the primary and secondary structures. Using the gate electrodes 1 as a mask, the oxide film 12a, the polysilicon bands 8b or 16a, and the oxide film 11a are successively etched to respectively form the gate oxide 12, the floating gate electrode 8 of the primary structure or the dummy floating gate electrode 16 of the secondary structure, and the floating gate oxide 11. Then, the source diffusion channels 2 and the drain diffusion channels 3 are formed by a common diffusion technique in the semiconductor substrate 10, as illustrated in FIGS. 2E, 4E, and 5E.

A smooth insulating layer 13 (8000 Å) is then disposed on the entire surface of the substrate 10 covering the diffusion channels or paths as well as the stacked-gate structures. The insulating film 13 is then etched so as to form the source contact hole 4 shown in FIG. 5F and the drain contact hole shown in FIG. 2F.

Finally, the metallic lead wires 6 and 7 are deposited perpendicularly to the matrix columns which are covered by the smooth insulating layer 13 except at the contact holes formed in the previous step, and the metal fills the contact holes, thus forming ohmic contacts between the diffusion channels 2 and 3 and the data and address wires. This results in the completion of the semiconductor memory device.

In the semiconductor memory device thus formed, the primary structures, which represent the memory array cells at each matrix intersection, are identical to the secondary structures which represent the connections between the source diffusion channels of the matrix column cells and the data lines. This is illustrated by comparing the cross-sectional view of the primary structure, shown in FIG. 2F, with the cross-sectional view of the secondary structure, shown in FIG. 5F. Therefore, the depth T2 of the source contact hole (the difference in height between the upper surface of the substrate 10 and the lower surface of the metallic lead wire 6) is substantially the same (approximately 15,100 Å) as the depth T1 of the drain contact hole (the difference in height between the upper surface of the substrate 10 and the lower surface of the second metallic lead wire 7). Upon the concurrent formation of the source and drain contact holes (4 and 5), neither one of them is over-etched, which results in forming ohmic contacts of minimum dimension and uniform height throughout the device. Furthermore, since the depth T2 (15,100 Å) of the source contact hole is much smaller than the depth T2 (20,100+Å) obtained in the prior art device of FIGS. 1–3, poor formation of the source ohmic contact and a disconnection failure of the metallic lead wire 6 can be eliminated.

To further decrease the depth T2, the dummy floating gate electrode 16 can be omitted so that a disconnection failure of the metallic lead wire 6 with the semiconductor substrate 10 can be further precluded.

Also, while the above embodiment uses a memory matrix in which the array of FET cells are of the stacked-gate type, another embodiment, shown in FIGS. 6–8, uses FET cells of the single-gate structure, thus eliminating the floating gate oxide film 11 and the polysilicon floating gate electrode 8 (16). In this embodiment, according to the presence/absence of a drain contact hole, the storage content of a cell can be identified as either "1" or "0" during the fabrication of the gate mask. As an example, a drain contact hole is removed from FIG. 6D as seen from the comparison with FIG. 4F.

Peripheral circuits, such as address decoders, address buffers, and input/output buffers, may be fabricated concurrently with the memory matrix on the same substrate 10.

As set forth above, according to the present invention, since the field insulating film is etched to provide film-free regions at the portion of the substrate extending from the source ohmic contact node to the gate column structure on either side of it, the cross-sectional structure of a memory cell and its drain ohmic contact node is identical to the cross-sectional structure of the ohmic connection between the source diffusion channels of each matrix column and the corresponding data line lead wire. This results in the formation of a device having extremely reliable ohmic contacts.

It is to be noted that, while the present invention has been described with reference to the above embodiments illustrated in the accompanying drawings, it should not be limited to them and may be applied with various modifications thereof without departing from the scope and spirit of the invention.

What we claim:

1. A semiconductor integrated circuit memory device comprising:
    a semiconductor substrate carrying FET memory transistor cells disposed in columns and rows in a matrix;
    a gate electrode layer carried by said substrate and providing gate electrodes forming an address line for each column or row of memory transistor cells in the matrix;
    an insulating film layer coating said gate electrode layer;
    a source diffusion layer disposed relative to said gate eelctrode layer to form a source diffusion channel for each column or row of memory transistor cells;
    a metallic wire layer disposed on said insulating film layer and said gate electrode layer forming lead wires extending orthogonally with respect to said gate electrodes and connected to said source diffusion channels at ohmic contact nodes formed in contact holes, thus forming connecting lead wires for transferring information between said source diffusion channels and a peripheral circuit;
    a drain diffusion layer disposed relative to said source diffusion layer and said gate electrode layer to form a drain diffusion channel for each column or row of memory transistor cells and connected to metallic lead wires at ohmic contact nodes formed in contact holes;
    the source diffusion channels and the drain diffusion channels providing signal channels, the ohmic nodes connecting to the signal channels having a layered structure including gate electrodes on either side thereof;
    the channels forming signal paths for addressing, control, or data flow to or from a peripheral circuit via the ohmic contact nodes on the channels;
    a field insulating film on said substrate dividing it into film-free source and drain diffusion channels defining the memory cell matrix and narrow film-free areas extending from certain of the ohmic contact nodes to the layered structure on either side thereof;
    whereby the depth of a source contact hole filled with metal to provide a source ohmic contact node for connecting the metallic lead wires to the source diffusion channels is substantially the same as the depth of a drain contact hole filled with metal to provide a drain ohmic contact node for connecting the drain diffusion channels to the metallic lead wires.

2. A semiconductor memory device having FET memory transistor cells disposed in columns and row in a matrix, said device comprising:
    a semiconductor substrate;
    a gate electrode layer carried by said substrate and forming gate electrode providing address lines for the columns or rows of memory transistor cells;
    an insulating film layer coating said gate electrode layer;
    a source diffusion layer in said substrate forming signal channels disposed in parallel with the gate electrodes to form the columns or rows of the memory matrix;
    a metallic wire layer forming metallic lead wires disposed on said insulating film layer and said gate electrode layer orthogonally with respect to the gate electrodes and connected to the source diffusion channels at ohmic contact nodes for transferring information between the source diffusion channels and a peripheral circuit, the source diffusion channels and the drain diffusion channels providing source diffusion channels, the ohmic contact nodes connecting to the source diffusion channels having a layered structure including gate electrodes on either side thereof;
    a drain diffusion layer in said substrate forming signal channels to form the column or rows of the memory matrix and connected to metallic lead wires at ohmic contact nodes for transferring information between the drain diffusion channels and a peripheral circuit, the ohmic contact nodes connecting to the drain diffusion channels having a layered structure including gate electrodes on either side thereof;
    a field insulating film on said substrate and etched therefrom to provide film-free regions above the source and drain diffusion channels and in the vicinity of certain of the ohmic contact nodes beneath layered structures on either side thereof;

whereby the depth of a source contact hole filled with metal to provide a source ohmic contact node for connecting a metallic lead wire to a source diffusion channel is substantially the same as that of a drain contact hole filled with metal to provide a drain ohmic contact node for connecting a drain diffusion channel to a metallic lead wire.

3. A semiconductor integrated circuit memory device having FET memory transistor cells disposed in columns and rows in a matrix, said device comprising:

a semiconductor substrate;

a gate electrode layer carried by said substrate and forming parallel gate electrodes with a gate electrode for each column or row of memory transistor cells in the matrix;

an insulating film layer coating said gate electrode layer;

a source diffusion layer in said substrate forming source diffusion channels disposed parallel to the gate electrodes with a source diffusion channel for each column or row of memory transistor cells in the matrix having a layered structure including a gate electrode on either side thereof;

a drain diffusion layer in said substrate forming a drain diffusion channel for each column or row of memory transistor cells in the matrix, the drain and source diffusion channels defining the memory cell matrix;

a metallic wire layer disposed on said insulating film layer and said gate electrode layer forming metallic lead wires extending orthogonally with respect to the gate electrodes and connected to said source diffusion channels and said drain diffusion channels at ohmic contact nodes, the channels forming signal paths for addressing, control, or data flow to or from peripheral circuits via the ohmic contact nodes;

a field insulating film on said substrate etched from above the source and drain diffusion channels and from short bands extending from each source ohmic contact node on a source diffusion channel to beneath the layered structures including the gate electrodes on either side thereof;

whereby the depth of source contact holes receiving metal of the metallic wire layer to provide the source ohmic contact node for connecting the metallic lead wires to the source diffusion channels and defined by the stacked layer structure on either side thereof above the short bands is substantially the same as the depth of drain contact holes receiving metal of the metallic wire layer to provide the drain ohmic contact nodes for connecting the metallic lead wires to the source diffusion channels.

4. A semiconductor memory device according to claims 3 further including a floating gate electrode layer providing floating gate electrodes disposed under the gate electrodes.

5. A semiconductor memory device according to claim 4 wherein said floating gate electrode layer includes a dummy floating gate electrode layer.

6. A semiconductor memory device according to claim 3 wherein said field insulating film comprises silicon dioxide.

7. A semiconductor memory device according to claim 3 wherein said metallic wire layer comprises an aluminum thin film.

8. A semiconductor memory device according to claim 3 wherein said gate electrode layer comprises a polysilicon film.

* * * * *